United States Patent
Endo et al.

(10) Patent No.: US 8,470,672 B2
(45) Date of Patent: Jun. 25, 2013

(54) METHOD OF MANUFACTURING SILICON CARBIDE SEMICONDUCTOR DEVICE

(75) Inventors: Takeshi Endo, Toyota (JP); Shinichiro Miyahara, Nisshin (JP); Tomoo Morino, Anjo (JP); Masaki Konishi, Toyota (JP); Hirokazu Fujiwara, Miyoshi (JP); Jun Morimoto, Nisshin (JP); Tsuyoshi Ishikawa, Nisshin (JP); Takashi Katsuno, Nisshin (JP); Yukihiko Watanabe, Nagoya (JP)

(73) Assignees: DENSO CORPORATION, Kariya (JP); Toyota Jidosha Kabushiki Kaisha, Toyota-shi (JP)

( * ) Notice: Subject to any disclaimer, the term of this patent is extended or adjusted under 35 U.S.C. 154(b) by 133 days.

(21) Appl. No.: 13/220,756

(22) Filed: Aug. 30, 2011

(65) Prior Publication Data
US 2012/0052642 A1    Mar. 1, 2012

(30) Foreign Application Priority Data
Aug. 31, 2010    (JP) .................... 2010-194633

(51) Int. Cl.
 *H01L 21/336*    (2006.01)
 *H01L 21/265*    (2006.01)

(52) U.S. Cl.
 USPC ............ 438/270; 438/285; 438/518; 438/931

(58) Field of Classification Search
 None
 See application file for complete search history.

(56) References Cited

U.S. PATENT DOCUMENTS

| | | | | |
|---|---|---|---|---|
| 5,321,289 A | * | 6/1994 | Baba et al. | 257/331 |
| 5,915,180 A | | 6/1999 | Hara et al. | |
| 5,976,936 A | * | 11/1999 | Miyajima et al. | 438/268 |
| 6,020,600 A | * | 2/2000 | Miyajima et al. | 257/76 |
| 6,107,135 A | | 8/2000 | Kleinhenz et al. | |
| 6,538,280 B2 | * | 3/2003 | Nakamura | 257/333 |
| 7,345,342 B2 | * | 3/2008 | Challa et al. | 257/341 |
| 2004/0214397 A1 | * | 10/2004 | Thapar | 438/270 |
| 2004/0229420 A1 | * | 11/2004 | Shibata | 438/202 |
| 2009/0311839 A1 | | 12/2009 | Miyahara et al. | |
| 2010/0006861 A1 | | 1/2010 | Yamamoto et al. | |

FOREIGN PATENT DOCUMENTS

JP    A-59-8374    1/1984

OTHER PUBLICATIONS

Office Action dated Sep. 20, 2012, received on Sep. 24, 2012 issued in corresponding DE application No. 102011080841.8 (and English translation).

* cited by examiner

*Primary Examiner* — Scott B Geyer
(74) *Attorney, Agent, or Firm* — Posz Law Group, PLC

(57) ABSTRACT

A method of manufacturing a semiconductor device includes forming a drift layer on a substrate; forming a base layer on the drift layer; forming a trench to penetrate the base layer and to reach the drift layer; rounding off a part of a shoulder corner and a part of a bottom corner of the trench; covering an inner wall of the trench with an organic film; implanting an impurity to a surface portion of the base layer; forming a source region by activating the implanted impurity; and removing the organic film after the source region is formed, in which the substrate, the drift layer, the base layer and the source region are made of silicon carbide, and the implanting and the activating of the impurity are performed under a condition that the trench is covered with the organic film.

8 Claims, 4 Drawing Sheets

METHOD OF MANUFACTURING SILICON CARBIDE SEMICONDUCTOR DEVICE

CROSS REFERENCE TO RELATED APPLICATION

This application is based on Japanese Patent Application No. 2010-194633 filed on Aug. 31, 2010, the disclosure of which is incorporated herein by reference.

TECHNICAL FIELD

The present invention relates to a method of manufacturing a silicon carbide (i.e., SiC) semiconductor device having a trench gate.

BACKGROUND

A vertical type MOSFET having a trench gate structure is disclosed in, for example, JP-A-S59-8374 and JP-A-H07-326755 (corresponding to U.S. Pat. No. 5,915,180A). It is important to ensure reliability of a gate insulation film in case of manufacturing a vertical type MOSFET having a trench gate structure with SiC semiconductors. A breakdown field strength of SiC is 10 times larger than that of silicon, and therefore a working voltage applied to a SiC semiconductor device can be 10 times larger than that applied to a silicon device. In this case, a field strength produced and applied to a gate insulation film, which is formed in the trench that is disposed in SiC, is 10 times larger than a field strength produced and applied to a silicon device, and the strong filed strength easily results in a breakdown of the gate insulation film, which is located at a corner of the trench.

To ensure the reliability of the gate insulation film, JP-A-2010-21175 (corresponding to U.S. 2010/0006861 A1) teaches a method of relaxing the field concentration by rounding off corner sections of a trench. Specifically, the rounding off is performed by hydrogen etching after the trench is formed.

However, a heavily-doped $N^+$-type layer of a trench shoulder (i.e., an entrance corner of the trench), which is removed by hydrogen etching, moves to a trench bottom as described in JP-A-2010-21175 (corresponding to U.S. 2010/0006861 A1). A prior art of forming the trench will be described with reference to FIG. 4A to FIG. 4D.

The conventional manufacturing method of the vertical type MOSFET includes following processes prior to the forming of the trench. Firstly, a $N^+$-type drift layer J2 and a P-type base layer J3 are grown epitaxially on a surface of a $N^+$-type SiC substrate J1 as shown in FIG. 4A. Then a $N^+$-type source region J4 is formed on a surface of the P-type base layer J3 by implanting ions of N-type impurity at a high concentration and activating the implanted ions as shown in FIG. 4B.

A trench J5 is formed by, for example, a RIE (i.e., Reactive Ion Etching) method after an etching mask (not shown) is disposed on a surface of the $N^+$-type source region J4 as shown in FIG. 4C. A part of the $N^+$-type source region J4, which is placed on the trench shoulder and removed by hydrogen etching, moves to the bottom of the trench J5, and forms a $N^+$-type high-concentration layer 36 on bottom corners as shown in FIG. 4D.

When a vertical type MOSFET having a $N^+$-type high-concentration layer 36 operates, electric field concentrates on the gate insulation film, and the concentrated electric field results in a breakdown of the gate insulation film. Further, the $N^+$-type high-concentration layer J6, which is formed on an inner wall of the trench J5, causes an increase in leak current between a source and a drain Thus, it is required for a manufacturing method of a SiC semiconductor device to prevent a high-concentration layer from being generated on the bottom of the trench when a process for forming the trench gate structure such as rounding off the trench 6 is carried out.

SUMMARY

In view of the foregoing problems, it is an object of the present invention to provide a manufacturing method of a SiC semiconductor device to prevent a high-concentration layer from being generated on the bottom of the trench.

According to an aspect of the present disclosure, a method of manufacturing a silicon carbide semiconductor device includes: forming a drift layer on a substrate having a first conductive type or a second conductive type; forming a base layer on the drift layer or in a surface portion of the drift layer; forming a trench to penetrate the base layer and to reach the drift layer; rounding off a part of a shoulder corner and a part of a bottom corner of the trench; covering an inner wall of the trench with an organic film; implanting an impurity having the first conductive type to a surface portion of the base layer; forming a source region by activating the implanted impurity in the surface portion of the base layer; removing the organic film after the forming of the source region; forming a gate insulation film on the inner wall of the trench; forming a gate electrode on the gate insulation film in the trench; forming a source electrode; and forming a drain electrode on a back side of the substrate. The substrate is made of silicon carbide. The drift layer is made of silicon carbide having the first conductive type, and is doped at a lower impurity concentration than impurity concentration of the substrate. The base layer is made of silicon carbide having the second conductive type. The shoulder corner of the trench is disposed at an open side of the trench. The implanting of the impurity is performed under a condition that the trench is covered with the organic film. The activating of the implanted impurity is performed under a condition that the trench is covered with the organic film. The source region is made of silicon carbide having the first conductive type, and is doped at a higher impurity concentration than that of the drift layer. The source electrode is electrically coupled with the source region and the base layer.

In the above method, the forming of the trench is performed before the forming of the source region, and the source region is formed under a condition that the trench is covered with the organic film after the rounding off process of the trench corners is performed. Thus, on the bottom of the trench, a formation of a high-concentration layer, which is caused by a movement of the removed part of the source region, can be prevented when the rounding off process of the trench and the activating of the implanted impurity by annealing are performed.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

A first embodiment of the present disclosure will be described. In the present embodiment, as a provided element of a SiC semiconductor device, an invert vertical type MOSFET having a trench gate structure will be described.

Figure 1:
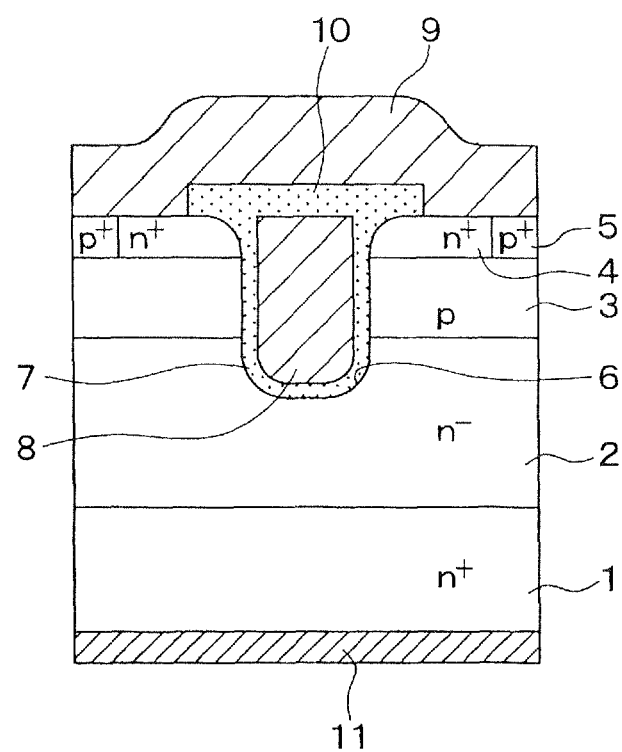
FIG. 1 is a diagram showing a cross sectional view of a vertical type MOSFE having a trench gate structure according to a first embodiment.

One cell of the vertical type MOSFET having a trench gate is shown in FIG. 1. However, multiple vertical type MOSFETs, which have the same structure with the vertical type MOSFET shown in FIG. 1, are arranged along with one another in multiple lines.

A $N^+$-type substrate 1 made of SiC is used as a semiconductor substrate to manufacture the vertical type MOSFET shown in FIG. 1. The $N^{30}$-type substrate 1 is doped with a N-type impurity such as phosphorus at a concentration of, for example, $1.0 \times 10^{19}/cm^3$, and is approximately 300 μm thick. A $N^-$-type drift layer 2 made of SiC is formed on the surface of the $N^+$-type substrate 1. The $N^-$-type drift layer 2 is doped with a N-type impurity such as phosphorus at a concentration of, for example, $5.0 \times 10^{15}/cm^3$ to $2.0 \times 10^{16}/cm^3$, and is approximately 8 μm to 15 μm thick. A P-type base layer 3 is formed in a surface portion of the $N^-$-type drift layer 2, and further, a $N^+$-type source region 4 and a $P^+$-type contact layer 5 are formed in a upside portion of the P-type base layer 3.

The P-type base layer 3 is doped with a P-type impurity such as boron or aluminum at a concentration of, for example, $5.0 \times 10^{16}/cm^3$ to $2.0 \times 10^{19}/cm^3$, and is approximately 2 μm thick. A surface portion of the $N^+$-type source region 4 is doped with a N-type impurity such as phosphorus at a concentration (i.e., surface concentration) of, for example, $1.0 \times 10^{21}/cm^3$, and is approximately 0.3 μm thick. A surface portion of the $P^+$-type contact layer 5 is doped with a P-type impurity such as boron or aluminum at a concentration (i.e., surface concentration) of, for example, $1.0 \times 10^{21}/cm^3$, and is approximately 0.3 μm thick. The $N^+$-type source regions 4 are disposed on both sides of a trench structure, which will be described later. The $P^+$-type contact layers 5 are disposed on the opposite sides of the trench structure across the $N^+$-type source regions 4.

A trench 6 is formed in the semiconductor substrate in such a manner that the trench 6 reaches the $N^-$-type drift layer 2 through the P-type base layer 3 and the $N^+$-type source region 4. The trench has a width of, for example, 1.4 μm to 2.0 μm and a depth of 2.0 μm or deeper (i.e., 2.4 μm). The P-type base layer 3 and the $N^+$-type source region 4 are disposed in contact with side walls of the trench 6.

An inner wall of the trench 6 is covered by a gate insulation film 7, and further, a gate electrode 8 made of doped poly silicon is formed on a surface of the gate insulation film 7 in such a manner that the trench 6 is filled with the gate electrode 8. The gate insulation film 7 is formed by, for example, thermal oxidization of the inner wall of the trench 6. A thickness of the gate insulation film 7 formed on the inner wall and the bottom of the trench 6 is approximately 100 nm.

Thus, the trench structure is formed in the semiconductor substrate. The trench structure extends longitudinally along with a direction perpendicular to the surface of a sheet of drawing of FIG. 1. Multiple trench gate structures align in a linear manner along with a direction parallel to the horizontal line of the surface of a sheet of a drawing of FIG. 1. Thus multiple cells of the trench gate structure are formed.

Additionally, a source electrode 9 and gate wiring (not shown) are formed on the surface of the $N^+$-type source region 4, the $P^+$-type contact layer 5 and the gate electrode 8. The source electrode 9 and the gate wiring are made of multiple kinds of metals such as Ni/Al. In the source electrode 9, a portion of the source electrode 9, which is directly contacted with N-type SiC (i.e., the $N^+$-type source region 4 and the gate electrode 8 when doped with a N-type impurity), is at least made of metals which can be in ohmic contact with N-type SiC, and a portion of the source electrode 9, which is directly contacted with P-type SiC (i.e., the $P^+$-type contact layer 5 and the gate electrode 8 when doped with a P-type impurity), is at least made of metals which can be in ohmic contact with P-type SiC. The source electrode 9 and the gate wiring are formed on an interlayer insulation film 10 so that the source electrode 9 and the gate wiring are electrically isolated from the $N^+$-type source region 4, the $P^+$-type contact layer 5 and the gate electrode 8. The source electrode 9 is electrically coupled with the $N^+$-type source region 4 and the $P^+$-type contact layer 5 via a contact hole formed in the interlayer insulation film 10, and the gate wiring is electrically coupled with the gate electrode 8 via another contact hole formed in the interlayer insulation film 10.

Additionally, a drain electrode 11, which is electrically coupled with the $N^+$-type substrate 1, is formed on the back side of the $N^+$-type substrate 1. Thus, an invert vertical type N-channel MOSFET having a trench gate is configured in above-described structure.

A method of manufacturing the trench gate structured vertical type MOSFET shown in FIG. 1 will be described. FIGS. 2A to 2D and FIGS. 3A to 3D are cross sectional views showing manufacturing processes of the trench gate structured vertical type MOSFET shown in FIG. 1. The manufacturing processes will be described with reference to FIGS. 2A to 2D and FIGS. 3A to 3D.

Figure 2A:
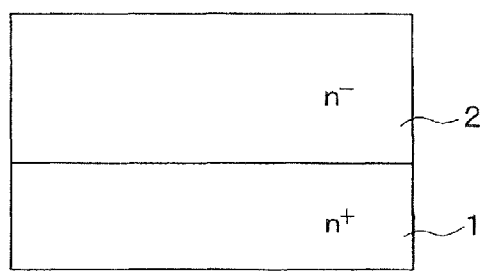
FIGS. 2A to 2D are diagrams showing cross sectional views of processes for manufacturing the vertical type MOSFET having a trench gate structure shown in FIG. 1, FIGS. 3A to 3D are diagrams showing cross sectional views of processes for manufacturing the vertical type MOSFET having a trench gate structure shown in FIG. 1 subsequent to FIG. 2D, and FIGS. 4A to 4D are diagrams showing cross sectional views of processes for manufacturing a conventional SiC semiconductor device prior to a forming of a trench.

[A process shown in FIG. 2A]

Firstly, a $N^+$-type substrate 1, which is doped with a N-type impurity such as phosphorus at a concentration of, for example, $1.0 \times 10^{19}/cm^3$, and is approximately 300 μm thick, is prepared. A $N^{--}$-type drift layer 2 made of SiC is grown epitaxially on a surface of the $N^+$-type substrate 1. The $N^{--}$-type drift layer 2 is doped with a N-type impurity such as phosphorus at a concentration of, for example, $5.0 \times 10^{15}/cm^3$ to $2.0 \times 10^{16}/cm^3$, and is approximately 10 μm thick.

Figure 2B:
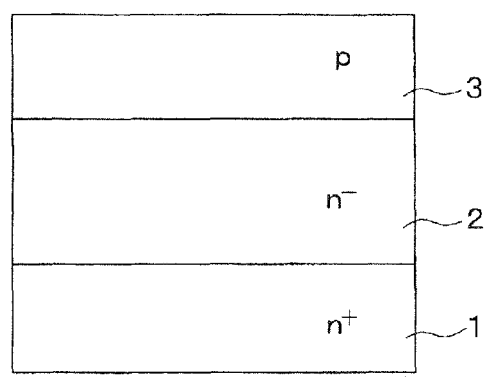

[A process shown in FIG. 2B]

A P-type base layer 3 is formed on a surface of the $N^{--}$-type drift layer 2 by epitaxial growth of a P-type layer, which is doped with a P-type impurity such as boron or aluminum at a concentration of, for example, $5.0 \times 10^{16}/cm^3$ to $2.0 \times 10^{19}/cm^3$, and is approximately 2 μm thick. The P-type base layer 3 may also be formed by implanting ions of P-type impurity to the surface portion of the $N^-$-type drift layer 2.

Figure 2C:
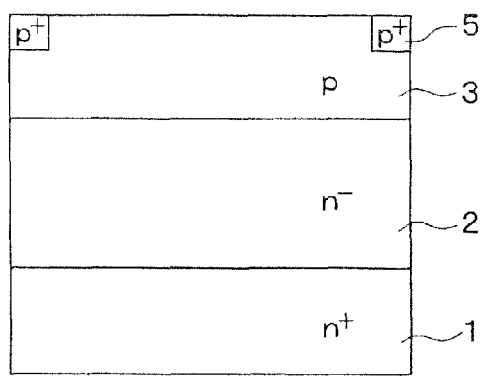

[A process shown in FIG. 2C]

A mask (not shown) made of, for example, LTO is formed on the P-type base layer 3 before the photolithography is carried out. After the photolithography, the mask formed on a predetermined region of a $P^+$-type contact layer 5 is removed. After the mask is removed, ions of P-type impurity such as boron or aluminum are implanted to the predetermined region of the $P^+$-type contact layer 5. The $P^+$-type contact layer 5, which is implanted with the ions of P-type impurity such as boron or aluminum at a concentration (i.e., surface concentration) of $1.0 \times 10^{21}/cm^3$ and approximately 0.3 µm thick, is formed by activating the implanted ions. Then the remained mask is removed.

Figure 2D:
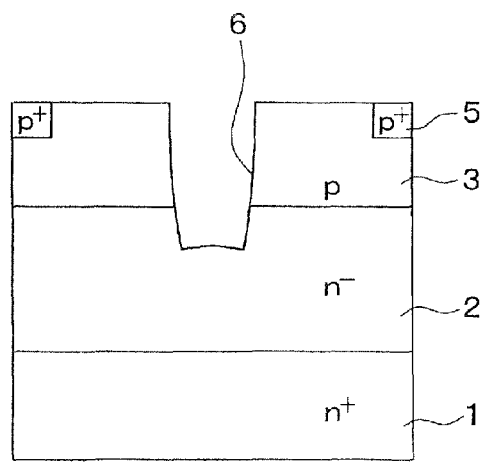

[A process shown in FIG. 2D]

An etching mask (not shown) is formed on the P-type base layer 3. Then a part of the etching mask formed on a predetermined region of a trench 6 is removed. The trench 6 is formed by anisotropic etching with the other part of P-type base layer 3 is covered with the etching mask. For example, $CF_4+O_2$ or $O_2$ is used as etching gas. After the trench 6 is formed, remained etching mask is removed.

Figure 3A:
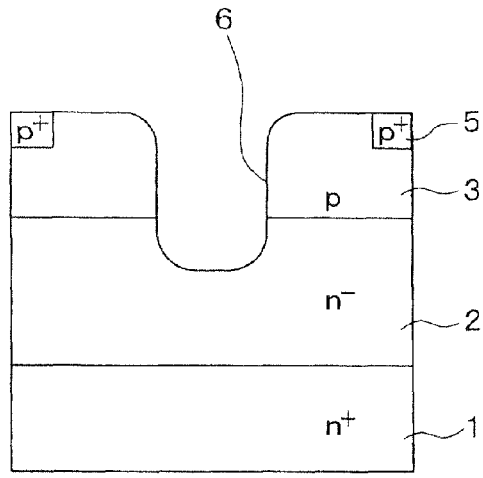

[A process shown in FIG. 3A]

The trench 6 is rounded off by, for example, a hydrogen etching method, a sacrificial oxidation method or a dry etching method. In a case where the hydrogen etching is performed to round off corners of the trench 6, hydrogen is introduced into an etching apparatus at an inside atmospheric temperature within a range of, for example, 1500° C. to 1700° C. In a case where the sacrificial oxidation is performed to round off corners of the trench 6, thermal oxidation is performed for approximately 100 minutes at a wet atmospheric temperature of 1100° C. After the trench is formed, an oxide film formed by the thermal oxidation is removed by hydrofluoric acid. In a case where the dry etching is performed to round off corners of the trench 6, for example, $SF_6$, $CF_4$, $CHF_3$ or $Cl_2$ is used as etchant gas.

Accordingly, part of corners placed on shoulders and bottom of the trench 6 can be rounded off by above-described processes. The shoulder corners of the trench 6 are rounded off before a $N^+$-type source region 4 is formed, and therefore, on the inner wall and the bottom of the trench 6, a formation of a $N^+$-type high-concentration layer caused by a movement of removed part of the trench shoulders can be prevented.

Figure 3B:
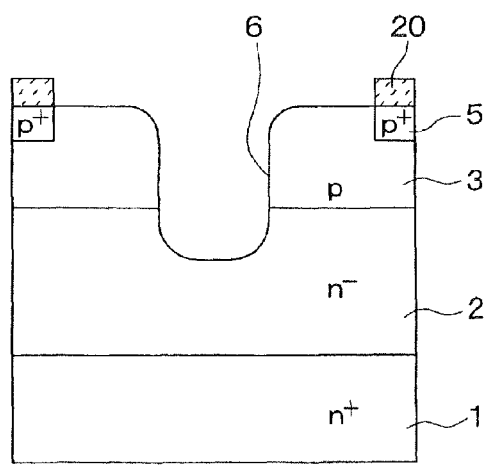

[A process shown in FIG. 3B]

The surface of the semiconductor substrate is coated with a resist 20, and is exposed with the surface is covered by a mask. In the mask, a part corresponding to the $P^+$-type contact layer 5 is removed. The resist 20 is remained only on the surface of the $P^+$-type contact layer 5 by performing a developing step.

Figure 3C:
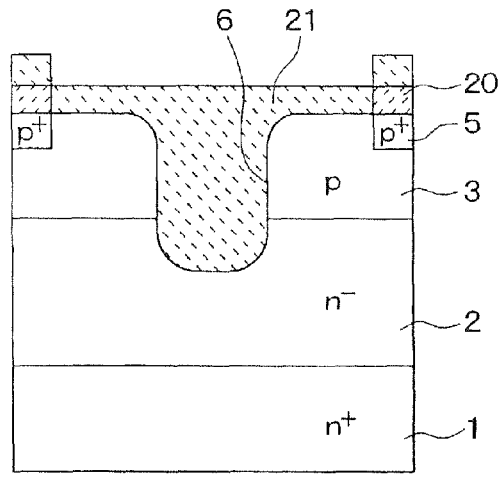

[A process shown in FIG. 3C]

The trench 6 is filled with a resist 21, which is made of organic material, by coating the resist 21 on the surface of the semiconductor substrate as an organic film. Organic material having a viscosity of 20 cp or less is used to make the resist 21. In a case where the resist 21 having a viscosity of 20 cp or less is used to fill the trench 6, the trench 6 can be filled more certainly, and a planarity of the resist 21 surface can be improved. A thickness of the resist 21 is not limited, with further consideration of an ion range of the following ion implantation process, the resist 21 on the surface of the P-type base layer 3 is formed to 1.0 µm thick.

Figure 3D:
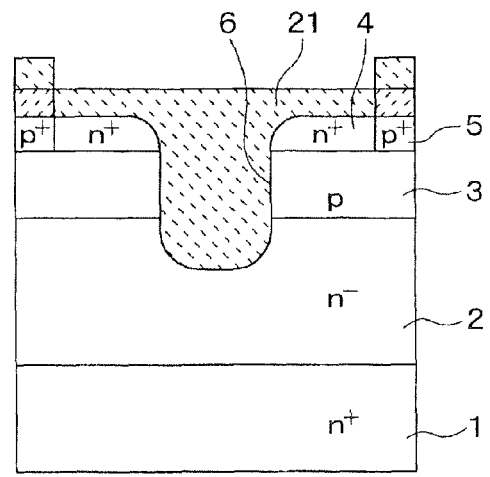
Figure 4A:
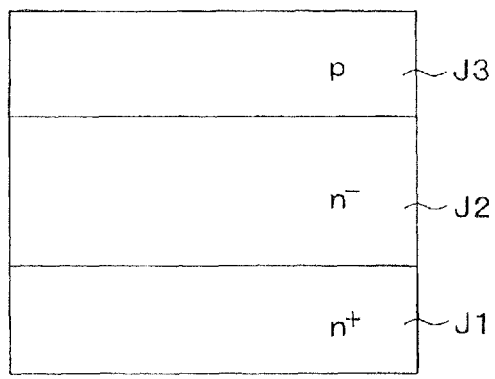
Figure 4B:
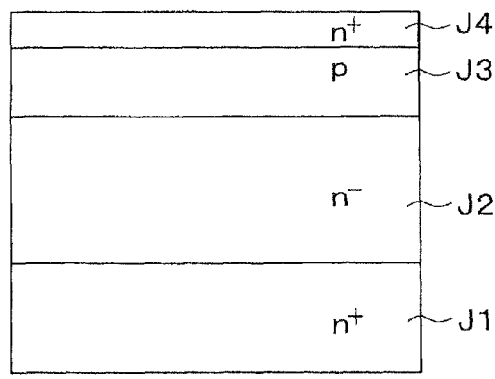
Figure 4C:
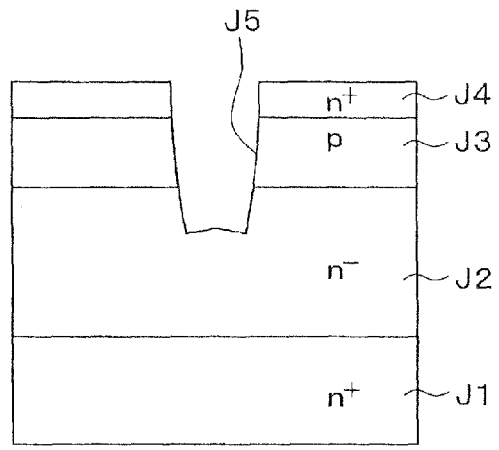
Figure 4D:
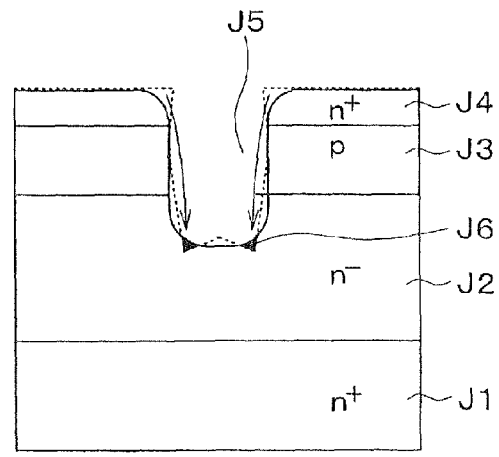

[A process shown in FIG. 3D]

A $N^+$-type source region 4 is formed by ion implantation of a N-type impurity such as nitrogen from an upside of the resist 20 and the resist 21. Because the resist 20 is remained on the $P^+$-type contact layer 5, the N-type impurity is implanted only into the predetermined region of the $N^+$-type source region 4, the resist 20 and the resist 21, and is not implanted to other SiC portions. In this ion implantation, the resist 20 and the resist 21 are used as a mask, and further, the resist 20 and the resist 21 may also be carbonized prior to the ion implantation by heating the resist in a vacuum at a temperature within a range of 800° C. to 1000° C. In this way, when an ion implantation is performed, a thermal change of the resist 20 and the resist 21 can be restricted, and further, ion implantation process can be stabilized. That is, the negative effect of implanting variations, which is caused by thermal change of the resist 20 and the resist 21, can be reduced. Thus, a stable ion implantation can be performed in a SiC substrate, which is heated at a specific temperature around 500° C.

The implanted N-type impurity is activated by an activation annealing process, which is performed at a temperature within a range of 1400° C. to 2000° C., with the inside of the trench 6 is filled with the resist 21. In this way, the $N^+$-type source region 4, which is doped with the N-type impurity such as phosphorus at a concentration (i.e., surface concentration) of $1.0 \times 10^{21}/cm^3$, and is approximately 0.3 µm thick, is formed. The inside trench 6 is covered by the resist 21, therefore a movement of the $N^+$-type source region 4 caused by a high temperature of the annealing process can be prevented, further a formation of a N-type high-concentration layer at the bottom of the trench 6 can be prevented.

The carbonized resist 20 and the carbonized resist 21 are removed by a oxygen plasma ashing method with an ashing equipment. The carbonized resist 20 and the carbonized resist 21 may also be removed by a dry oxidation method or a wet oxidation method. Both the dry oxidation and the wet oxidation are performed at a temperature of 600° C. or higher in an oxidation furnace filled with $O_2$ atmosphere. As described, the carbonized resist 20 and the carbonized resist 21 can be removed easily by a wet oxidation method, a dry oxidation method or a $O_2$ ashing method.

Following processes are not shown by figures, because the processes are the same with the conventional art. In the trench 6, a gate oxide film is formed, and functions as a gate insulation film 7. In the trench 6, a poly silicon layer, which functions as a gate electrode 8, is formed on the surface of the gate oxide film, and is etched back. The poly silicon is doped with a N-type impurity. In this way, the gate insulation film 7 and the gate electrode 8 are formed in the trench 6. An interlayer insulation film 10 is formed on the poly silicon layer. A contact hole connected to the $N^+$-type source region 4 and the $P^+$-type contact layer 5 is formed on a cross section of the interlayer insulation film 10 by patterning. Another contact hole connected to the gate electrode 8 is formed on another cross section of the interlayer insulation film 10 by patterning. Films made of electrode material are formed in the contact holes in such a manner that the contact holes are filled with the electrode material. In the electrode material, which is filled in the contact holes, a source electrode 9 and gate wiring are formed separately in each contact hole by patterning. Further, a drain electrode 11 is formed on the back side of the $N^+$-type substrate 1. The process of forming the source electrode 9 and gate wiring and the process of forming the train electrode 11 can be replaced. In this way, the vertical type MOSFET shown in FIG. 1 is manufactured.

In the present embodiment of the manufacturing method, the trench 6 is formed prior to the formation of the $N^+$-type source region 4, further ion implantation and activation annealing for forming the $N^+$-type source region 4 are performed with the inside of the trench 6 is covered with the resist 21 after the trench 6 is rounded off. Thus, when rounding off the trench 6 and activation annealing are performed, on the inner wall and bottom of the trench 6, the formation of the N-type high-concentration layer caused by a movement of the removed part of the $N^+$-type source region 4 can be prevented. Accordingly, a method of manufacturing a SiC semiconductor device is provided, and can prevent the formation of the N-type high-concentration layer on the bottom of the trench 6 when a process of forming the trench gate structure such as rounding off the trench 6 is carried out.

(Other Embodiments)

In the first embodiment, a method of removing the carbonized resist 20 and the carbonized resist 21 by the wet oxidation method, the dry oxidation method or the $O_2$ ashing method is described. The carbonization of the resist 20 and the resist 21 is not limited to a substantial carbonization by a carbonization treatment, and also includes a carbonization during a heat treatment such as the activation annealing. That is, without carbonization treatment, the resist 21 can be also carbonized during the heat treatment such as activation annealing, which is performed after the ion implantation. Also in this case, the resist 21 can be removed by the wet oxidation method, the dry oxidation method or the $O_2$ ashing method. A maximum temperature of the wet oxidation and the dry oxidation may also be controlled according to the material (i.e., Si or C) of the semiconductor substrate. Specifically, in a case where the surface portion of the semiconductor substrate is a Si-face, the oxidation temperature may be set to 1000° C. or lower, in a case where the surface of the semiconductor substrate is a C-face, the oxidation temperature may be set to 900° C. or lower. In this way, ion implanted layer is prevented from being oxidized, and further, a loss of ion implanted layer can be reduced.

In the above embodiments, a SiC semiconductor device with an invert vertical type MOSFET having a trench gate structure is described as an example. Alternatively, the SiC semiconductor device may include a storage vertical type MOSFET having a trench gate. Specifically, in the SiC semiconductor device having a structure described in each of the above embodiments, a N-channel can be formed on the inner wall of the trench 6 by doping a N-type impurity such as phosphorus at a concentration of, for example, $1.0 \times 10^{16}/cm^3$ after the rounding off inside corners of the trench 6 and the formation of the N$^+$-type source region 4 are performed. The N-channel layer forms a channel region, and formed to have a thickness for providing a normally-off type device. For example, in the trench 6, a thickness of the N-channel layer formed on the bottom can be 0.3 μm to 1.0 μm, and the thickness of the N-channel layer formed on the inner wall can be 0.1 μm to 0.3 μm.

In each of the above embodiments, a N-channel type vertical type MOSFE in which a first conductive type corresponds to a N-type, and a second conductive type corresponds to a P-type is described as an example. Alternatively, the SiC semiconductor device may include a P-channel type vertical type MOSFET with each composition element having a conductive type opposite to the N-channel type vertical type MOSFET. Additionally, a vertical type MOSFET having a trench gate structure is described as an example. Alternatively, the SiC semiconductor device may include a vertical IGBT having the same trench gate structure with the vertical type MOSFET. In this case, the N$^+$-type substrate 1 is replaced to a P-type substrate in each of the above embodiments, and the other structure and manufacturing method are the same in each of the above embodiments.

Various respects of the above embodiments can be appropriately changed. For example, the P$^+$-type contact layer 5 is formed before the trench 6 is formed. Alternatively, the P$^+$-type contact layer 5 may also be formed after the trench 6 is formed and rounded off. Further, an oxide film formed by thermal oxidation is described as the gate insulation film. Alternatively, an oxide film formed by a method other than thermal oxidation or a nitride film may also be used as the gate insulation film.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method of manufacturing a silicon carbide semiconductor device comprising:
   forming a drift layer on a substrate having a first conductive type or a second conductive type;
   forming a base layer on the drift layer or in a surface portion of the drift layer;
   forming a trench to penetrate the base layer and to reach the drift layer;
   rounding off a part of a shoulder corner and a part of a bottom corner of the trench;
   covering an inner wall of the trench with an organic film;
   implanting an impurity having the first conductive type to a surface portion of the base layer;
   forming a source region by activating the implanted impurity in the surface portion of the base layer;
   removing the organic film after the forming of the source region;
   forming a gate insulation film on the inner wall of the trench;
   forming a gate electrode on the gate insulation film in the trench;
   forming a source electrode to be electrically coupled with the source region and the base layer; and
   forming a drain electrode on a back side of the substrate,
   wherein the substrate is made of silicon carbide,
   wherein the drift layer is made of silicon carbide having the first conductive type, and is doped at a lower impurity concentration than an impurity concentration of the substrate,
   wherein the base layer is made of silicon carbide having the second conductive type,
   wherein the shoulder corner of the trench is disposed at an open side of the trench,
   wherein the implanting of the impurity is performed under a condition that the trench is covered with the organic film,
   wherein the activating of the implanted impurity is performed under the condition that the trench is covered with the organic film, and
   wherein the source region is made of silicon carbide having the first conductive type, and is doped at a higher impurity concentration than an impurity concentration of the drift layer.

2. The method according to claim 1,
   wherein the rounding off is performed by a hydrogen etching method, a sacrificial oxidation method or a dry etching method.

3. The method according to claim 1,
   wherein the source electrode is formed on an interlayer insulation film, which is formed on the gate electrode.

4. The method according to claim 1,
   wherein the organic film is made of a resist.

5. The method according to claim 4,
   wherein the resist has a viscosity of 20 cp or less.

6. The method according to claim 4, further comprising:
   performing a heat treatment to carbonize the resist before the implanting of the impurity.

7. The method according to claim 1,
wherein the removing of the organic film is performed by a wet oxidation method, a dry oxidation method or a $O_2$ ashing method.

8. The method according to claim 7,
wherein an oxidation temperature is set to 1000° C. or lower in a case where a surface of the substrate is a Si-face, and wherein an oxidation temperature is set to 900° C. or lower in a case where the surface of the substrate is a C-face.

* * * * *